(12) United States Patent
Singh et al.

(10) Patent No.: US 7,576,545 B2
(45) Date of Patent: Aug. 18, 2009

(54) LITHIUM-ION BATTERY PROGNOSTIC TESTING AND PROCESS

(75) Inventors: Harmohan N. Singh, Rockaway, NJ (US); James S. Johnson, Prescott Valley, AZ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/550,566

(22) Filed: Oct. 18, 2006

(65) Prior Publication Data

US 2008/0094031 A1    Apr. 24, 2008

(51) Int. Cl.
*G01N 27/416* (2006.01)

(52) U.S. Cl. .............. 324/427; 324/429; 324/432; 320/132; 320/149

(58) Field of Classification Search .......... 320/132, 320/149; 324/426–427, 431–432
See application file for complete search history.

(56) References Cited

U.S. PATENT DOCUMENTS

| | | | |
|---|---|---|---|
| 6,064,182 A | 5/2000 | Eguchi | |
| 6,366,054 B1 * | 4/2002 | Hoenig et al. | 320/132 |
| 2003/0112011 A1 * | 6/2003 | Guiheen et al. | 324/429 |
| 2005/0001627 A1 * | 1/2005 | Anbuky et al. | 324/427 |
| 2005/0269993 A1 | 12/2005 | Palanisamy | |
| 2006/0022676 A1 * | 2/2006 | Uesaka et al. | 324/429 |

FOREIGN PATENT DOCUMENTS

| | | |
|---|---|---|
| EP | 1 505 402 A | 2/2005 |
| FR | 2 734 061 A | 11/1996 |
| WO | WO 02/42786 A | 5/2002 |

OTHER PUBLICATIONS

European Search Report Dated Mar. 27, 2008.

\* cited by examiner

*Primary Examiner*—Akm E Ullah
*Assistant Examiner*—Ramy Ramadan
(74) *Attorney, Agent, or Firm*—Oral Caglar, Esq.

(57) ABSTRACT

In accordance with various embodiments, there are systems and methods for predicting end of life of a Li-ion battery. The method can include at least one of partially charging and partially discharging a battery, measuring an open circuit voltage of the battery before and after at least one of partial charging and partial discharging, and determining a state of charge value of the battery corresponding to the open circuit voltage measured before and after at least one of partial charging and partial discharging. The method can also include correlating at least one of a charge energy and a discharge energy with a change in the state of charge value and extrapolating to get a full battery capacity, tracking the full battery capacity as a function of time, and performing trend analysis of the full battery capacity over time to predict the battery's end of life.

12 Claims, 4 Drawing Sheets

LITHIUM-ION BATTERY PROGNOSTIC TESTING AND PROCESS

DESCRIPTION OF THE INVENTION

1. Field of the Invention

The subject matter of this invention relates to lithium ion and lithium polymer batteries. More particularly, the subject matter of this invention relates to the methods of monitoring lithium ion battery and predicting a battery's end of life.

2. Background of the Invention

Lithium ion batteries including lithium polymer batteries are rechargeable batteries with some unique set of characteristics such as one of the best energy-to-weight ratios, no memory effect, and a slow loss of charge when not in use. Hence, lithium ion batteries are utilized in a wide variety of technological areas such as medical devices, aerospace, electronics, radio and cellular telecommunication networks, satellites, electric and hybrid vehicles, etc. Some of these applications require lithium ion battery prognosis to determine the battery's end of life. Over the years, Li-iodine batteries have replaced nickel-cadmium batteries and zinc-mercury battery as a power source for the implantable cardiac pacemaker. Though Li-iodine-polyvinylpyridine batteries lasts for about ten years, generally they do not outlast average patient's lifetime and therefore it is essential to monitor the battery's full capacity and predict battery's end of life before the pacemaker needs battery replacement, as sudden end of battery life can be extremely damaging to patient's health. Another exemplary application for lithium ion battery is for emergency power supply, such as a backup battery on an airplane that provides power when the other sources fail. Even though the back up battery is rarely used, the battery ages and as a result its capacity fades. In such circumstances, the user needs to know when the battery will no longer have the capacity required to meet the emergency if it should arise, so the battery can be replaced. Currently such applications require manual intervention to remove the battery and perform a test which actually drains the battery power to confirm that the capacity required is still available. This test must be done with sufficient frequency to ensure that the power required will be available when needed. An automatic test could provide more timely information on battery capacity and reduce system maintenance.

Accordingly, the present invention solves these and other problems of the prior art by providing apparatus and method of predicting battery's end of life.

SUMMARY OF THE INVENTION

In accordance with the invention, there is a method for determining full capacity of a Li-ion battery including partially charging a battery with a known state of charge by applying a constant current and measuring an open circuit voltage of the battery before and after the step of partial charging. The method can also include determining a state of charge value of the battery corresponding to the open circuit voltage measured before and after the step of partial charging. The method can further include correlating a charge energy with a change in the state of charge to determine a full capacity of the battery, wherein the charge energy is the energy required for charging at a constant current until the voltage across the battery reaches a predetermined value and the change in the state of the charge is the difference in the state of charge value of the battery before and after the partial charge.

According to another embodiment, there is a method for determining full capacity of a Li-ion battery including partially discharging a battery with a known state of charge by applying a load and measuring an open circuit voltage of the battery before and after the step of partial discharging. The method can also include determining a state of charge value of the battery corresponding to the open circuit voltage measured before and after the step of partial discharging. The method can further include correlating a discharge energy with a change in the state of charge to determine the full capacity of the battery, wherein the discharge energy is the energy required for discharging until the voltage across the battery reaches a predetermined value and the change in the state of the charge is the difference in the state of charge value of the battery before and after the partial discharge.

According to yet another embodiment, there is a method for predicting end of life of a Li-ion battery including at least one of partially charging and partially discharging a battery and measuring an open circuit voltage of the battery before and after the step of at least one of partial charging and partial discharging. The method can also include determining a state of charge value of the battery corresponding to the open circuit voltage measured before and after the step of at least one of partial charging and partial discharging and correlating at least one of a charge energy and a discharge energy with a change in the state of charge value and extrapolating to get a full battery capacity, wherein the charge energy or discharge energy is the energy required for partial charging or partial discharging and the change in the state of the charge is the difference in the state of charge value before and after at least one of the partial charge or partial discharge. The method can further include tracking the battery's full capacity as a function of time and performing trend analysis of the battery's full capacity over time to predict the battery's end of life.

According to another embodiment, there is a system for predicting end of life of a Li-ion battery including an instrumentation and control module including an analog-to-digital converter, a digital-to-analog converter, and an electronics control signal generator. The system can also include a power supply that supplies a current to partially charge the battery and a current sensor disposed in series between the power supply and the battery to measure a current passing to the battery from the power supply. The system can further include a load to partially discharge the battery and a current sensor disposed in series between the load and the battery to measure the current passing through the load. The system can also include a voltage sensor electrically connected to the battery to measure an open circuit voltage of the battery before and after at least one of a partial charge and a partial discharge of the battery and a computer with a processor that determines the full capacity of the battery, prepares a trend analysis of the battery's full capacity as a function of time, and predicts battery's end of life.

According to yet another embodiment, there is a computer readable medium comprising program code that configures a processor to perform a method for predicting end of life of a Li-ion battery, said program code including a program code for at least one of partial charging and partial discharging the battery, a program code for measuring an open circuit voltage of the battery before and after the step of at least one of partial charging or partial discharging, a program code for determining a state of charge value of the battery corresponding to the open circuit voltage measured before and after the step of at least one of partial charging or partial discharging, a program code for correlating at least one of a charge energy and a discharge energy with a change in state of charge and extrapolating to get the battery's full capacity and a program code for performing trend analysis of the battery's full capacity over time to predict the battery's end of life.

Additional advantages of the embodiments will be set forth in part in the description which follows, and in part will be obvious from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

BRIEF DESCRIPTION OF THE DRAWINGS

FIGS. 2 and 2-1 show typical charge and discharge curves for a lithium ion cell.

DESCRIPTION OF THE EMBODIMENTS

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

The term "lithium ion battery" is used interchangeably with Li-ion battery, lithium ion battery, and lithium polymer battery.

Figure 1:
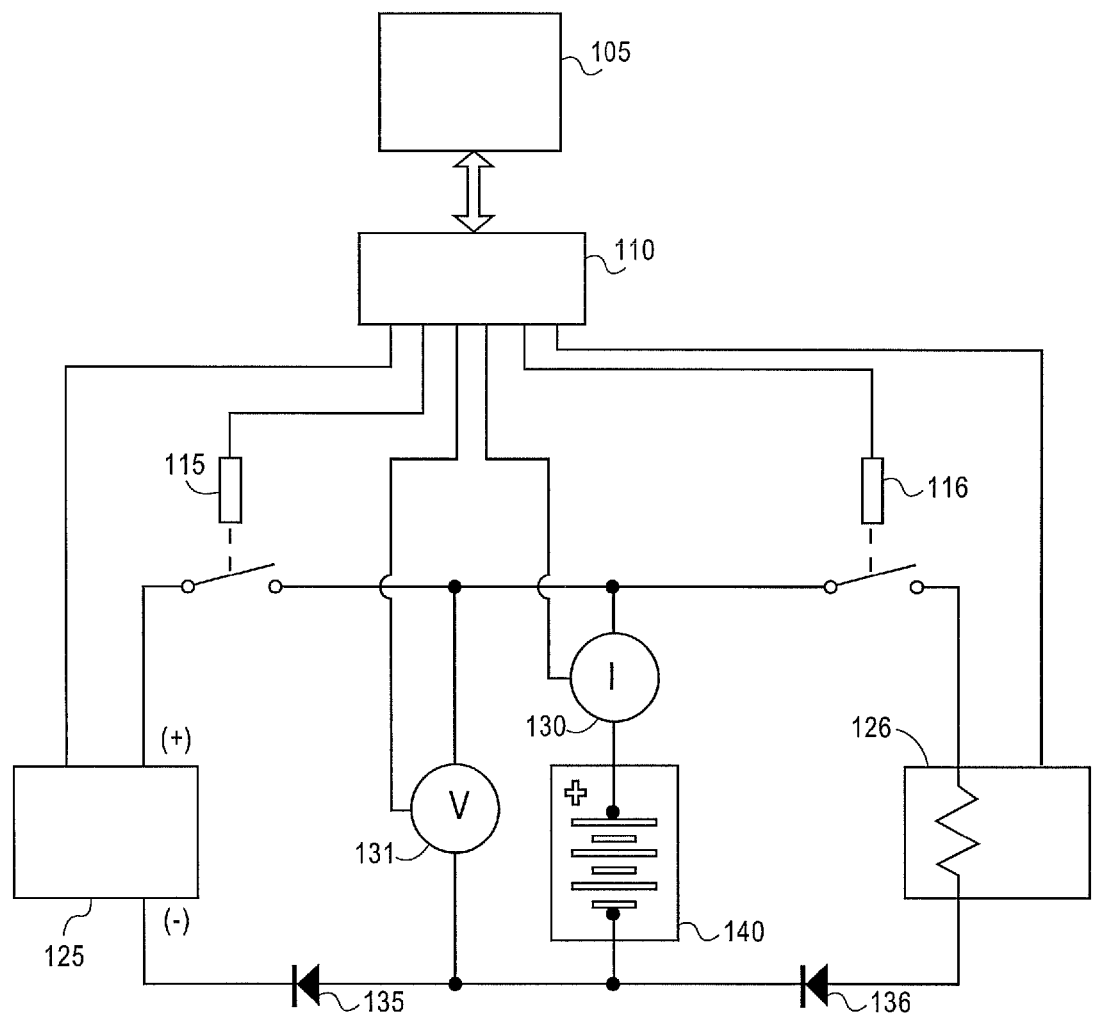
FIG. 1 depicts an exemplary system for determining capacity and predicting end of life of a lithium ion battery in accordance with the present teachings.

FIG. 1 depicts an exemplary system 100 for determining capacity and for predicting end of life of a lithium ion battery. The exemplary system 100 can include various modules, such as a computer 105, an instrumentation and control module 110, two control relays 115 and 116, a power supply 125, an electronic load 126, a current sensor 130, and a voltage sensor 131. Also shown in FIG. 1 is a battery 140, such as a lithium ion battery, and two blocking diodes 135 and 136.

In the exemplary system 100, the computer 105 can be connected to the instrumentation and control module 110. The computer 105 can be any suitable computer such as, such as personal computer (PC). In various embodiments, the computer 105 can include a set of measurement and analysis algorithms. The computer 105 can also include any software drivers that can be used to control other modules of the exemplary system 100. In various embodiments, the instrumentation and control module 110 can include an analog-to-digital converter (ADC), a digital-to-analog converter (DAC), an electronic control system (ECS), and various signal conditioning modules. The ADC can be used for measuring various system voltages while the DAC can be used to program the power supply 125 and/or the electronic load 126. The ECS can be configured by using various commercial off-the-shelf (COTS) modules such as the ones available from National Instruments Corporation. In some embodiments, the ECS under command of the computer 105 can control battery charging relay 115, to activate charging of the battery 140 through the power supply 125. The blocking diode 135 can be used to limit the direction of current flow from the power supply 125 to the battery 140 during charging. The power supply 125, in conjunction with the instrumentation and control module 110, can apply a constant current to the battery 135 to partially charge the battery 135. The power supply 125 can be, for example, a Hewlett Packard model 6032A power supply. In other embodiments, the instrumentation and control module 110 can control battery discharging relay 116, to activate discharging of the battery 140 through the electronic load 126 and the blocking diode 136. The electronic load 126, in conjunction with the instrumentation and control module 110, can apply at least one of a constant or a variable load to the battery 135 to partially discharge the battery 135.

Referring to FIG. 1, in some embodiments, the system 100 can include a current sensor 130 disposed in series between the battery 135 and the power supply 125 to measure the charge current. In other embodiments, the current sensor 130 can be disposed in series between the battery 135 and the electronic load 120 to measure the discharge current. The current sensor 130 can be an ammeter, a current shunt, or a similar functioning device. An exemplary current sensor 130 can include, for example, a 50-amp/50-millivolt shunt connected to a channel of the ADC. The 50-amp/50-millivolt shunt selection is exemplary of batteries where currents up to 50-amps may be encountered. The shunt selection can be performed to result in measurement sensitivity suitable for the battery being tested. Other suitable techniques can also be used to measure current, such as the Hall effect device. The sensed voltage, an analog quantity, can be converted to digital form by ADC in the instrumentation and control module 110. The digital data of these parameters can be supplied to the control computer 105. In this manner, the current sensor 130 can be used to measure the amount of current going to or coming from the battery 140. This can be performed by measuring the voltage drop across the current shunt and dividing the voltage drop by the shunt resistance.

The system 100 can also include a voltage sensor 131 electrically connected to the battery 135 to measure an open circuit voltage of the battery 140 before and after at least one of partial charge or partial discharge of the battery 140. The voltages measured by the voltage sensor 131 are all rested or quiescent battery voltages. The system 100 can further include a computer 105 with a processor that records and tracks the full capacity of the battery 140 as a function of time and performs a trend analysis of the battery's full capacity to predict battery's 140 end of life.

In some embodiments, the system 100 can also include a temperature sensor to measure the temperature of the battery 140.

According to various embodiments, there is a method for determining full capacity ($C_{Full}$) of a Li-ion battery. The method can include partially charging the battery 140, from a known state of charge ($SOC_{Before}$) by applying a constant current through the power supply 125 and the blocking diode 135. In some embodiments, the method can include depolarizing the battery 140 before partial charging to bring the battery voltage to a rested or equilibrium state. The method can also include measuring an open circuit voltage (OCV) of the battery 140 before ($OCV_{Before}$) and after ($OCV_{After}$) partial charging by the voltage sensor 131. Furthermore, according to various embodiments, the $OCV_{Before}$ and $OCV_{After}$ are rested or quiescent battery voltages. In other embodiments, the battery 140 can be depolarized, when there is not sufficient time for the battery 140 to reach the rested or quiescent state. In some embodiments, a constant current ($I_0$) for example, 1 amp can be applied by monitoring the charging current from the power supply 125 into the battery 140 using the current sensor 130. In various embodiments, the method can include selecting partial charge region from a discharge curve, as shown in FIG. 2.

Figure 2:
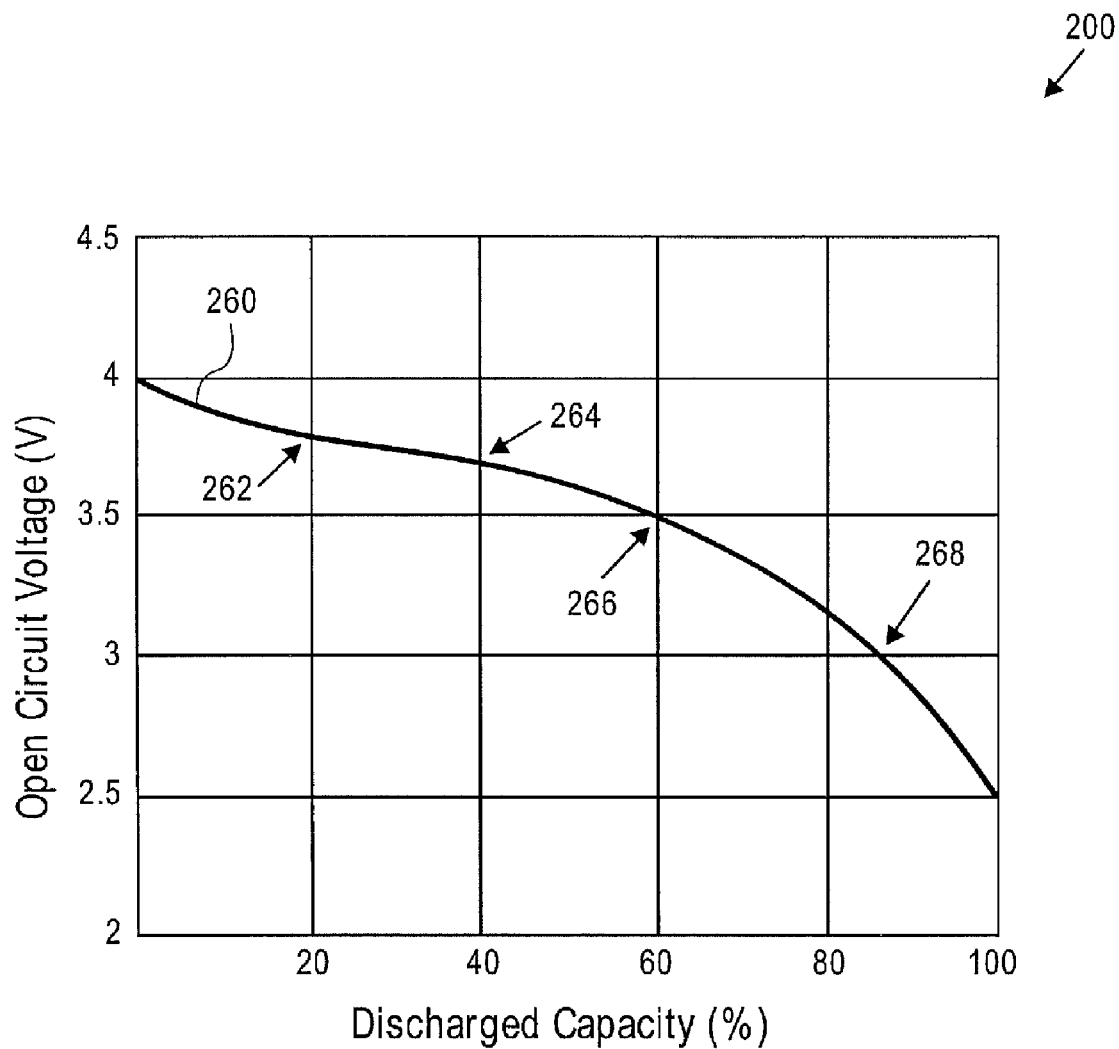
Figures 1, 2:
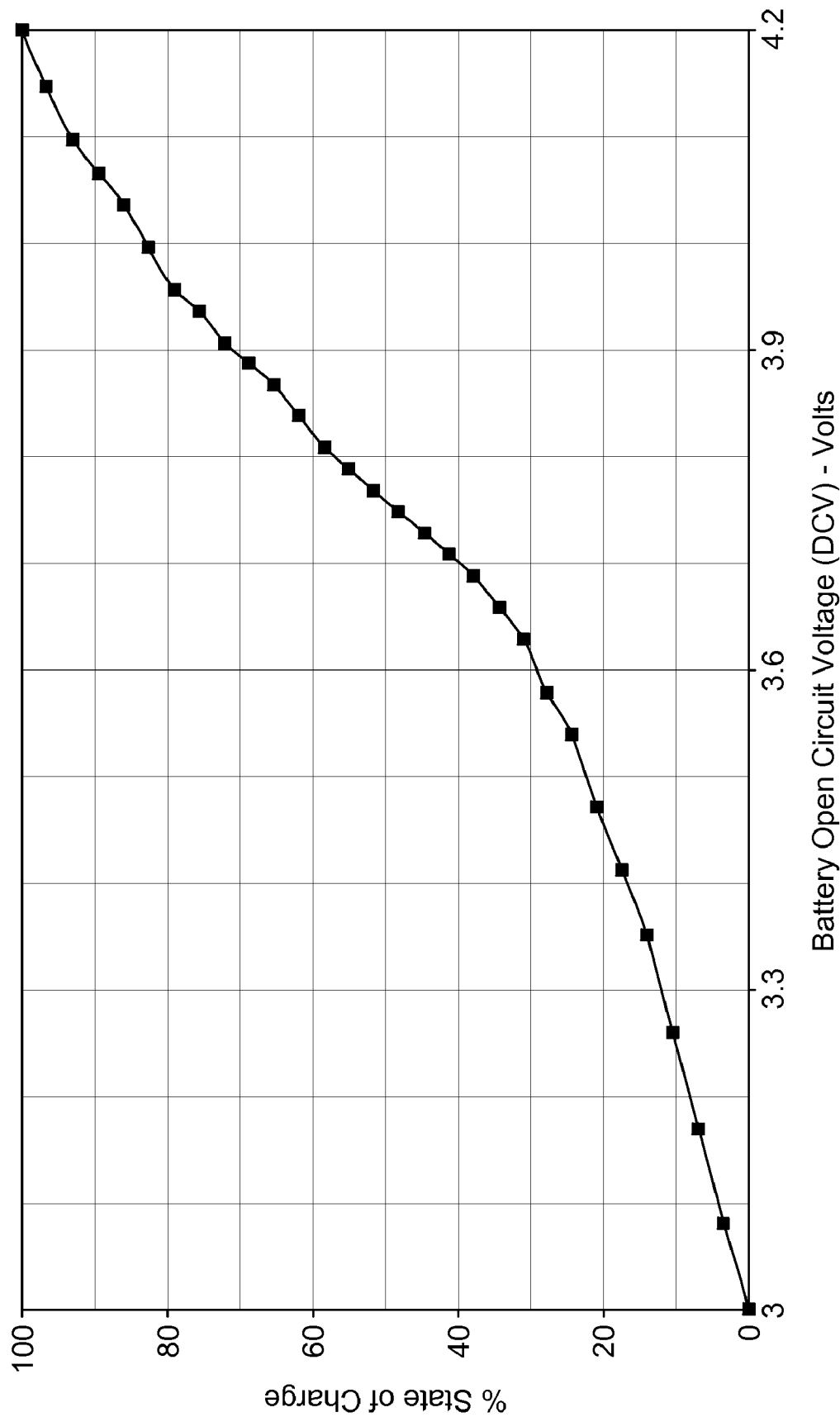

FIG. 2 shows a typical discharge curve 260 for a Li-ion cell. In FIG. 2, the curve 260 is an exemplary curve providing rested open circuit voltage versus discharged capacity, i.e. the capacity removed, for a Li-ion cell. The discharge curve 260 can be used to develop a discharge curve for a battery including multiple cells. For example, for a four cell battery, the voltage scale of the discharge curve 260 for a Li-ion cell can be multiplied by four and for a battery with n cells, the voltage scale of the discharge curve 260 for a Li-ion cell can be multiplied by n. Furthermore, in the curve 260, higher measurement resolution can be required in measuring the voltage change between about 20% 262 and about 40% 264 as compared to that between about 60% 266 and about 85% 268.

Turning back to the method for determining full capacity ($C_{Full}$) of a Li-ion battery, in some embodiments, the method can also include selecting a partial charge region from a charge curve (see FIG. 2-1), which may be similar to a charge curve disclosed in U.S. Pat. No. 6,774,636, the disclosure of which is incorporated by reference by reference in full. Furthermore, in some other embodiments, the method can include selecting partial charge region from the steepest region of the discharge curve, i.e. the region of the discharge curve with the highest slope. For example, the partial charging of the battery 140 can be selected between the regions 268 and 266 in the exemplary discharge curve 260 in FIG. 2. The battery 140 comprising n cells, at 268 corresponds to discharged capacity of about 85% and battery OCV of about n*3 V. The battery 140 at 266 corresponds to discharged capacity of about 60% and battery OCV of about n*3.5 V. In various embodiments, the battery 140 can be charged at C-rate in the range of about 0.1C to about 1C, the recommended rate for the battery 140 by the manufacturer of the battery 140. In various embodiments, the partial charging of the battery 140 can be stopped when the battery OCV reaches about n*3.5 V.

The method can further include determining a state of charge value ($SOC_{Before}$ and $SOC_{After}$) of the battery 140 corresponding to the open circuit voltage (OCV) measured before ($OCV_{Before}$) and after ($OCV_{After}$) the partial charging. In some embodiments, the state of charge (SOC) value can be determined by looking at least one of a graph and a look up table of SOC versus OCV. In other embodiments, the tables and graph of SOC versus OCV can be generated at various temperatures by performing the charge-discharge-charge procedure described in U.S. Pat. No. 6,774,636, the disclosure of which is incorporated by reference in full. The method can also include correlating the charge energy ($\Delta E$) with the change in the state of charge ($\Delta SOC$) as given in equation 2 to determine the full capacity ($C_{Full}$) of the battery 140. The charge energy ($\Delta E$) is the energy required for charging the battery at a constant current ($I_0$) and the change in the state of charge ($\Delta SOC$) value is the difference in the state of charge value before ($SOC_{Before}$) and after ($SOC_{After}$) the partial charge, i.e., $$\Delta SOC = SOC_{After} - SOC_{Before} \quad (1)$$

$$C_{Full} * \Delta SOC = \Delta E \quad (2)$$

It should be noted that the full capacity ($C_{Full}$) of the battery 140 is at a temperature of the discharge or the charge curve used for partial charging. In various embodiments, the battery's full capacity ($C_{Full}$) at another temperature can be derived from the capacity versus temperature curve for the battery/cell, generally available from the battery/cell manufacturer. Yet, in some other embodiments, the full capacity ($C_{Full}$) of a Li-ion battery can be determined as a function of temperature.

According to various embodiments, there is another method for determining full capacity ($C_{Full}$) of a Li-ion battery. The method can include partially discharging the battery 140, from a known state of charge ($SOC_{Before}$), by applying at least one of a constant or a variable load using the electronic load 126. In some embodiments, the method can include depolarizing battery 140 before partial discharging. In some embodiments, a predetermined load profile can be used to discharge the battery 140. The method can also include measuring the open circuit voltage (OCV) of the battery 140 before ($OCV_{Before}$) and after ($OCV_{After}$) partial discharging, by the voltage sensor 131. Additionally, the $OCV_{Before}$ and the $OCV_{After}$ are rested or quiescent battery voltages. In some embodiments, the battery 140 can be depolarized, when there is not sufficient time for the battery 140 to reach the rested or quiescent state. According to various embodiments, the method can include selecting a partial discharge region from the discharge curve, as shown in FIG. 2. In other embodiments, a charge curve can be used to select the partial charge region. In various embodiments, the method can further include selecting partial discharge region from the steepest region, i.e. the region with the highest slope, of the discharge curve. For example, the region between 266 and 268 with the highest slope in the exemplary discharge curve 260 as shown in FIG. 2 can be selected for the partial discharging of the battery 140. Hence, in FIG. 2, the battery 140 can be discharged from the capacity of about 60% at 266 to about 85% at 268. The battery 140 can be discharged at C-rate in the range of about 0.1C to about 1C, the recommended discharge rate for the battery 140 by the manufacturer of the battery 140. In various embodiments, the partial discharging of the battery 140 can be stopped when the battery OCV reaches about n*3.0 V.

The method can further include determining a state of charge value ($SOC_{Before}$ and $SOC_{After}$) of the battery 140 corresponding to the open circuit voltage (OCV) measured before ($OCV_{Before}$) and after ($OCV_{After}$) the partial discharging. In some embodiments, the state of charge (SOC) value can be determined by looking at least one of a graph and a look up table of SOC versus OCV. The method can also include correlating the discharge energy ($\Delta E$) with the change in the state of charge ($\Delta SOC$) as described in equation 2 to determine the full capacity ($C_{Full}$) of the battery 140. Furthermore, it should be noted that the full capacity ($C_{Full}$) of the battery 140 is at a temperature of the discharge or the charge curve used for partial discharging. In various embodiments, the battery's full capacity ($C_{Full}$) at another temperature can be derived from the capacity versus temperature curve for the battery/cell, generally available from the battery/cell manufacturer. Yet, in some other embodiments, the full capacity ($C_{Full}$) of a Li-ion battery can be determined as a function of temperature.

Figure 3:
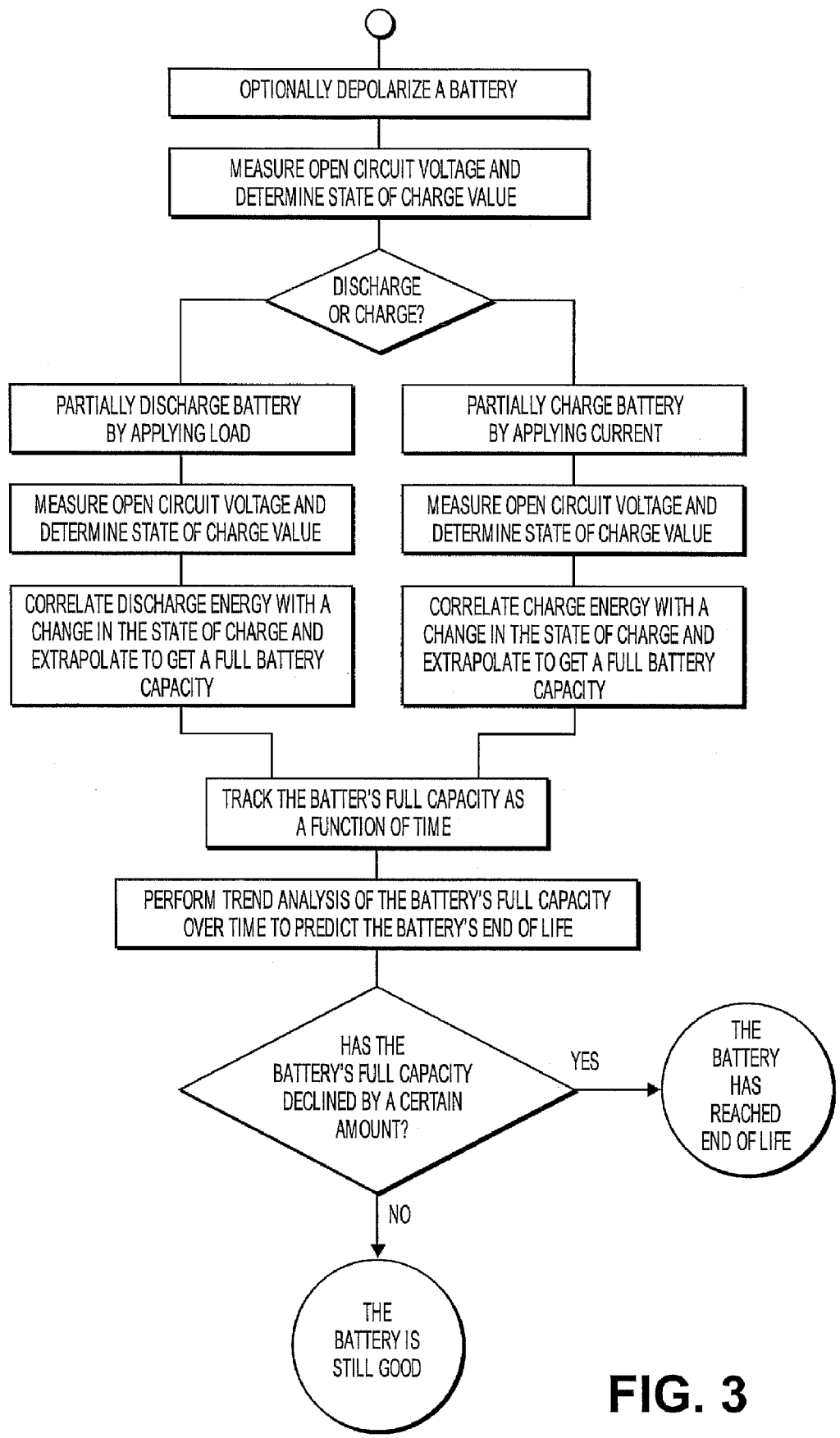
FIG. 3 depicts a flow chart of an exemplary method for determining full capacity and predicting end of life of a Li-ion battery.

According to various embodiments, there is a method for predicting end of life of a Li-ion battery. FIG. 3 depicts a flow chart of an exemplary method for predicting end of life of a Li-ion battery. The method can include at least one of charging and discharging a battery 140 partially and measuring the open circuit voltage of the battery 140 before ($OCV_{Before}$) and after ($OCV_{After}$) at least one of partial charging and partial discharging. Additionally, the $OCV_{Before}$ and the $OCV_{After}$ are rested or quiescent battery voltages. In some embodiments, the battery 140 can be depolarized, when there is not sufficient time for the battery 140 to reach the rested or quiescent state. In various embodiments, the method can include selecting at least one of a partial charge region and a partial discharge region from at least one of a charge curve and a discharge curve. In other embodiments, the method can further include selecting at least one of a partial charge region and a discharge region from the steepest region, i.e. the region with the highest slope, of the at least one of the charge and discharge curve. The method can also include determining a state of charge ($SOC_{Before}$ and $SOC_{After}$) value of the battery 140 corresponding to the open circuit voltage (OCV) measured before ($OCV_{Before}$) and after ($OCV_{After}$) at least one of partial charging and partial discharging. The method can further include correlating at least one of charge energy or discharge energy ($\Delta E$) with a change in the state of charge value ($\Delta SOC$) and extrapolating to get the full battery capacity ($C_{Full}$), as given by equation 2, wherein the charge energy or discharge energy ($\Delta E$) is the energy required for partial charging or partial discharging, and the change in the state of the charge ($\Delta SOC$) is the difference in the state of charge value before ($SOC_{Before}$) and after ($SOC_{After}$) the partial charge or partial discharge. The method can further include tracking the battery's full capacity ($C_{Full}$) as a function of time and performing trend analysis of the battery's full capacity ($C_{Full}$) over time to predict battery's end of life. In some embodiments, the step of performing trend analysis can further include determining whether the battery's full capacity has declined by a certain amount, wherein the certain amount depends upon the application in which the battery 140 is used.

According to various embodiments, there is a computer readable medium containing program code that configures a processor to perform a method for predicting end of life of a Li-ion battery 140. The program code can include program code for at least one of partial charging or partial discharging and program code for measuring an open circuit voltage of the battery 140 before and after at least one of partial charging or partial discharging. In some embodiments, there can be a program code for determining a state of charge value of the battery 140 corresponding to the open circuit voltage measured before and after at least one of partial charging or partial discharging and for correlating at least one of charge energy or discharge energy with a change in the state of charge to determine battery's full capacity. In other embodiments, there can be program code for tracking battery's full capacity as a function of time and for performing trend analysis of the battery's full capacity over time to predict the battery's end of life.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for determining full capacity of a Li-ion battery comprising:
   depolarizing the battery until the battery is in a quiescent state;
   measuring a first open circuit voltage of the battery;
   determining a first state of charge value of the battery corresponding to the first open circuit voltage;
   partially charging the battery with a known state of charge by applying a constant current until the battery exhibits a measured second open circuit voltage of n*3.5 V, wherein n is equal to the number of cells of the battery;
   determining a second state of charge value of the battery corresponding to the second open circuit voltage measured after the step of partial charging; and
   correlating a charge energy with a change in the state of charge to determine a full capacity of the battery;
   wherein the charge energy is the energy required for charging at a constant current until the voltage across the battery reaches a predetermined value; and
   wherein the change in the state of the charge is the difference between the first state of charge value of the battery and the second state of charge value of the battery.

2. The method according to claim 1, wherein the step of partial charging further comprises selecting a partial charge region from at least one of a charge and a discharge curve.

3. The method according to claim 2, wherein the step of partial charging further comprises selecting the partial charge region from the steepest region of at least one of the charge and discharge curves.

4. The method according to claim 1, wherein the battery is charged at a charge rate of about 0.1C to about 1C.

5. The method according to claim 1, wherein the state of charge value of the battery is determined by at least one of looking at a graph and a look up table of a state of charge versus open circuit voltage of the battery.

6. The method according to claim 1 further comprising determining full capacity as a function of temperature.

7. A method for predicting end of life of a Li-ion battery comprising:
   depolarizing the battery until the battery is in a quiescent state;
   measuring a first open circuit voltage of the battery;
   determining a first state of charge value of the battery corresponding to the first open circuit voltage;
   partially charging a battery until the battery exhibits a measured second open circuit voltage value that is n*3.5 V, wherein n is equal to the number of cells of the battery;
   determining a second state of charge value of the battery corresponding to the second open circuit voltage measured after the step of partial charging;
   correlating a charge energy with a change in the state of charge value and extrapolating to get a full battery capacity, wherein the charge energy is the energy required for partial charging and the change in the state of the charge is the difference between the first state of charge value and the second state of charge value;

recording and tracking the battery's full capacity as a function of time; and performing trend analysis of the battery's full capacity over time to predict the battery's end of life.

8. The method of claim 7, wherein the step of partially charging a battery further comprises selecting a partial charge region from the steepest region of a charge curve.

9. The method of claim 7, wherein the step of performing trend analysis comprises determining whether the battery's full capacity has declined by a certain amount, wherein the certain amount depends upon the application in which the battery is used.

10. A system for predicting end of life of a Li-ion battery comprising:

an instrumentation and control module comprising an analog-to-digital converter, a digital-to-analog converter, and an electronics control signal generator;

a depolarizing device for depolarizing the battery to a quiescent state;

a power supply that supplies a current to partially charge the battery until the battery exhibits an open circuit voltage of n'3.5 V, where n is equal to the number of cells of the battery;

a current sensor disposed in series between the power supply and the battery to measure a current passing to the battery from the power supply;

a voltage sensor electrically connected to the battery to measure the open circuit voltage of the battery before and after the partial charge of the battery, wherein a first state of charge value of the battery and a second state of charge value of the battery correspond to a first open circuit voltage and a second open circuit voltage measured before and after the partial charge, respectively;

a computer with a processor that determines the full capacity of the battery by correlating a charge energy with a change in a state of charge value and extrapolating to get a full battery capacity, wherein the charge energy is the energy required for partial charging and the change in the state of the charge is the difference between the first state of charge value and the second state of charge value, prepares a trend analysis of the battery's full capacity as a function of time, and predicts battery's end of life.

11. A system of claim 7, further comprising a temperature sensor for measuring a temperature of the battery.

12. A computer readable medium comprising program code that configures a processor to perform a method for predicting end of life of a Li-ion battery, said program code comprising:

a program code for depolarizing the battery to a quiescent state;

a program code for partial charging the battery;

a program code for measuring an open circuit voltage of the battery before and after the step of partial charging;

a program code for ending the partial charging upon measurement of an open circuit voltage of n*3.5 V, wherein n is equal to the number of cells of the battery;

a program code for determining a state of charge value of the battery corresponding to the open circuit voltage measured before and after the step of partial charging;

a program code for correlating a charge energy with a change in state of charge and extrapolating to get the battery's full capacity; and a program code for performing trend analysis of the battery's full capacity over time to predict the battery's end of life.

* * * * *